United States Patent
Purushothaman

(10) Patent No.: US 9,225,333 B2
(45) Date of Patent: Dec. 29, 2015

(54) SINGLE SUPPLY LEVEL SHIFTER WITH IMPROVED RISE TIME AND REDUCED LEAKAGE

(71) Applicant: Texas Instruments Incorporated, Dallas, TX (US)

(72) Inventor: Soman Purushothaman, Kerala (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 6 days.

(21) Appl. No.: 14/186,849

(22) Filed: Feb. 21, 2014

(65) Prior Publication Data

US 2015/0244372 A1  Aug. 27, 2015

(51) Int. Cl.
*H03K 19/0175* (2006.01)
*H03K 19/0185* (2006.01)
*H03K 19/00* (2006.01)
*H03K 19/003* (2006.01)

(52) U.S. Cl.
CPC .... *H03K 19/018521* (2013.01); *H03K 19/0013* (2013.01); *H03K 19/00384* (2013.01)

(58) Field of Classification Search
CPC .................. H03K 19/18521; H03K 3/356113; H03K 19/018528; H03K 19/017581; H03K 19/00315; H03K 19/0013; H03K 19/00384; H03K 19/018585; G09G 2310/0289

USPC .......................................... 326/68, 81, 83, 87
See application file for complete search history.

(56) References Cited

U.S. PATENT DOCUMENTS

| 5,229,659 | A  | * | 7/1993 | Sandhu ........................... 326/83 |
| 5,359,240 | A  | * | 10/1994 | Sandhu ........................... 326/83 |
| 6,278,295 | B1 | * | 8/2001 | Lovett ............................. 326/83 |
| 7,119,578 | B2 | * | 10/2006 | Correale et al. ................ 326/81 |
| 7,368,952 | B2 | * | 5/2008 | Ojiro ............................... 326/87 |
| 7,508,242 | B2 | * | 3/2009 | Tokuno .......................... 327/108 |
| 7,969,191 | B2 | * | 6/2011 | Nedalgi .......................... 326/81 |

* cited by examiner

*Primary Examiner* — Vibol Tan
(74) *Attorney, Agent, or Firm* — Andrew Viger; Frank D. Cimino

(57) ABSTRACT

A single supply level shifter converts an input logic level IN into level shifted OUT and OUT_X. An IN inverter generates level-shifted OUT at an OUT Node. IN is coupled at an INT Node to a $V_{DD}$ supply rail, through an INT_Node PFET that controls the INT Node based on OUT_X. An OUT_X network includes a separate IN_X inverter (generating inverted IN independent of level shifting), and an OUT_X circuit that controls pull-up/down of an OUT_X Node to generate level-shifted OUT_X, receiving control inputs from both IN and IN_X inverters. The OUT_X circuit is a three FET stack: a pull-up/down PFET/NFET pair receives IN_X, and an OUT_X Node control PFET, coupled between the pull-up PFET and the OUT_X Node, receives OUT. Based on OUT and IN_X, the OUT_X circuit generates OUT_X as an inverted OUT (including supplying OUT_X to the INT_Node PFET to control the INT Node (including OUT pull-up).

18 Claims, 3 Drawing Sheets

SINGLE SUPPLY LEVEL SHIFTER WITH IMPROVED RISE TIME AND REDUCED LEAKAGE

BACKGROUND

1. Technical Field

This Patent Document relates generally to logic level shifting, such as can be used to interface separate circuits/modules operating in different voltage domains (different voltage supply levels).

2. Related Art

Logic level shifters convert logic levels from one voltage domain to another, operating with different supply voltages. The voltage domains can be between different modules of a single IC (integrate circuit), such as core and I/O, or between different ICs.

Logic level shifters can be implemented with single or dual supply configurations. Single supply level shifters enable logic level conversion between voltage domains without requiring separate supply rails (in multi-IC configurations, without requiring separate supply pins). However, a disadvantage of single supply level shifters is increased static power consumption due to increased leakage currents. In particular, as supply voltages are decreased with scaling, the leakage component of total power dissipation increases in significance.

FIG. 1 illustrates a single supply level shifter 10. An input inverter M1/M2 is coupled to a supply network M3/M4 at an INT Node. The input inverter M1/M2 receives a logic signal IN (IN=1,0) and outputs a level shifted OUT (inverted IN) at an OUT Node. A following OUT_X inverter M5/M6 outputs OUT_X (inverted OUT) at an OUT_X Node. The single supply network includes a pull-up PFET M3 in parallel with a diode connected NFET M4. PFET M3 is controlled by feedback control corresponding to OUT_X.

For IN=0 (OUT=1), M2 pulls up the OUT node (M1 is switched off), switching M5 off and M6 on pulling down the OUT_X node. OUT_X=0 is fed back to switch off PFET M3. Initially, the OUT node is pulled up toward $V_{DD}$ (minus the M4 diode drop) by M2/M4. In response to OUT_X=0, PFET M3 switches on to pull up the INT node to $V_{DD}$ (minus a $V_{TH}$), completing pull-up of the OUT Node to OUT=1 (note that the OUT Node is loaded by M6 pulling down the OUT_X Node).

For IN=1 (OUT=0), M2 is switched off and M1 is switched on, pulling down the OUT node, and switching M6 off and M5 on. M5 pulls up the OUT_X node, and OUT_X=1 switches off PFET M3. With M3 off, the INT node ($V_S$ of M2) is below $V_{DD}$ by the M4 diode drop, ensuring M2 is switched off by IN=1.

This type of design for a single supply level shifter presents a number of disadvantages to minimizing leakage, particularly where optimizing logic level rise times is a design consideration. For example, the diode-connected NFET is slow, always on, and loads the INT node (requiring larger M2 and therefore larger M1). The pull-down NFET M6 loads the OUT node, degrading rise time for OUT=1–increasing NFET W can improve OUT_X pull-down, and thus OUT pull-up via M3, but results in higher loading at OUT, which at least partially counters the effect of increasing NFET W.

BRIEF SUMMARY

This Brief Summary is provided as a general introduction to the Disclosure provided by the Detailed Description and Figures, summarizing some aspects of the disclosed invention. It is not a detailed overview of the Disclosure, and should not be interpreted as identifying key elements of the invention, or otherwise characterizing the scope of the invention disclosed in this Patent Document.

The Disclosure describes apparatus and methods for logic level shifting adaptable for operation with a single supply, as "single supply" is defined in the Disclosure, including a voltage domain with a positive supply and a ground/reference that can be circuit ground.

In various embodiments, a level shifting methodology according to this Disclosure enables level shifting an input logic signal IN with logic_0 (IN=0) and logic_1 (IN=1) states to a corresponding level shifted output logic signal that is one of OUT or OUT_X (corresponding to an inverted OUT).

In one embodiment, a single supply level shifting methodology includes providing, in response to the input logic signal IN, both OUT at an OUT Node and IN_X at an IN_X Node, both corresponding to inverted IN. In particular, OUT at the OUT Node is provided by pulling up the OUT Node for OUT=1 (inverted IN=0), and pulling down the OUT Node for OUT=0 (inverted IN=1).

This embodiment of the methodology further includes providing, based on OUT and IN_X, OUT_X as an inverted OUT at an OUT_X Node, including: (a) providing pull-up/down for the OUT_X Node based on respectively IN_X=0 and IN_X=1; and (b) controlling OUT_X Node pull-up/down based on an OUT control signal corresponding to OUT at the OUT Node. In response to IN_X and the OUT control signal, OUT_X is generated by: (a) for IN_X=0 and OUT=0, pulling up the OUT_X Node to generate OUT_X=1; and (b) for IN_X=1 and OUT=1, terminating OUT_X Node pull-up, and pulling down the OUT_X Node to OUT_X=0.

This embodiment of the methodology further includes controlling an INT Node coupled between the OUT Node and the supply rail, based on an OUT_X control signal corresponding to OUT_X. Controlling the INT Node includes pulling up the INT Node based on OUT_X=0, and terminating INT Node pull-up based on OUT_X=1.

As a result, this embodiment of the single supply level shifting methodology enables controlling pull-up of the OUT and OUT_X Nodes based on respectively the OUT_X and OUT control signals, by: (a) for IN=0 (OUT=1, OUT_X=0), pulling down the OUT_X Node to OUT_X=0 in response to IN_X=1 and an OUT=1 control signal, and providing an OUT_X=0 control signal to control INT Node pull-up, and as a result pulling up the OUT Node to OUT=1; and (b) for IN=1 (OUT=0, OUT_X=1), pulling up the OUT_X Node to OUT_X=1 in response to IN_X=0 and an OUT=0 control signal, and providing an OUT_X=1 control signal to terminate INT Node pull up, and enable pulling down the OUT Node to OUT=0.

In other embodiments of the single supply level shifting methodology: (a) providing OUT as an inverted IN at an OUT Node is accomplished by an IN inverter including PFET and NFET transistors, gate coupled at the IN Node, and drain-coupled at the OUT Node, the PFET source coupled to the INT Node and the NFET source coupled to the ground/reference; and (b) the INT Node can be controlled by an INT_Node PFET transistor source coupled to the supply rail and drain coupled to the INT Node, and gate coupled to receive the OUT_X control signal, and can be configured such that, in response to an OUT_X=1 control signal, the INT Node is disconnected from the supply rail.

In other embodiments of the single supply level shifting methodology, providing OUT_X as an inverted OUT at an OUT_X Node is accomplished by an OUT_X network configured to provide OUT_X as an inverted OUT at the OUT_X Node, including providing the OUT_X control signal to the INT_Node PFET, where the OUT_X network includes: (a) an IN_X inverter configured to receive IN from the IN Node, and provide IN_X as an inverted IN at an IN_X Node; and (b) OUT_X circuitry including OUT_X Node pull-up/down circuitry and a OUT_X_Node PFET series coupled between the pull-up PFET and the OUT_X Node, and gate coupled to the OUT Node to receive OUT as an OUT control signal. The OUT_X Node pull-up/down circuitry includes pull-up PFET and pull-down NFET transistors, gate coupled to the IN_X Node, the pull-up PFET source coupled to the supply rail, and the pull-down NFET drain coupled to the OUT_X Node and source coupled to the ground/reference. The OUT_X circuitry is configured to control OUT_X based on IN_X and the OUT control signal, such that: (a) for IN=0, the OUT_X circuitry receives IN_X=1 at the pull-up/down PFET and NFET, and an OUT=1 control signal at the OUT_X_Node PFET, pulling down the OUT_X Node to OUT_X=0, and providing an OUT_X=0 control signal to the INT_Node PFET, which pulls-up the INT Node and as a result the OUT Node is pulled up to OUT=1, and (b) for IN=1, the OUT_X circuitry receives IN_X=0 at the pull-up/down PFET and NFET, and an OUT=0 control signal at the OUT_X_Node PFET, pulling up the OUT_X Node to OUT_X=1, and providing an OUT_X=1 control signal to the INT_Node PFET, terminating pull-up of the INT Node.

Other aspects and features of the invention claimed in this Patent Document will be apparent to those skilled in the art from the following Disclosure.

DETAILED DESCRIPTION

This Description and the Figures disclose example embodiments and implementations that illustrate various features and advantages of the invention, aspects of which are defined by the Claims. Known circuits, functions and operations are not described in detail to avoid unnecessarily obscuring the principles and features of the invention.

As used in this Disclosure and the Claims, the term "single supply" level shifter circuit means a level shifter configured for a voltage domain characterized by a positive supply designated $V_{DD}$ and a "ground/reference" sometimes designated $V_{SS}$ (which for dual supply designs designates a negative supply). Commonly, single supply level shifter designs will use $V_{DD}$ and circuit ground ($V_{SS}$=0). However, for level shifter designs based on the single supply architecture of the invention, the ground/reference is not required to be zero volts. Instead, the requirement for the $V_{SS}$ ground/reference as used in single supply level shifter designs according to the invention (including the illustrated example embodiment) is that (i) $V_{SS}$ is significantly less than $V_{DD}$, and (ii) $V_{SS}$ for the IN (input) domain is substantially the same as $V_{SS}$ for the level shifter domain. That is, the $V_{SS}$ reference/ground should be substantially the same for both the IN domain and the level shifter domain.

In brief overview, in various example embodiments, a single supply level shifter converts an input logic level signal IN into level shifted OUT and OUT_X. An IN inverter generates OUT at an OUT Node. The IN inverter is coupled at an INT node to a $V_{DD}$ supply rail, through an INT_Node PFET that controls the INT Node based on OUT_X. An OUT_X network includes a separate IN_X inverter (generating inverted IN independent of level shifting), and an OUT_X circuit that controls pull-up/down of an OUT_X Node to generate OUT_X. The OUT_X circuit receives control inputs from both IN and IN_X inverters, and controls pull-up/down at the OUT_X Node. The OUT_X circuit is configured as a three FET stack: a pull-up/down PFET/NFET pair receives IN_X (inverted IN), and an OUT_X Node control PFET, coupled between the pull-up PFET and the OUT_X Node, receives OUT (inverted IN). Based on OUT and IN_X, the OUT_X circuit generates OUT_X as an inverted OUT (including supplying OUT_X to the INT_Node PFET to control the INT Node (including OUT pull-up).

Figure 2:
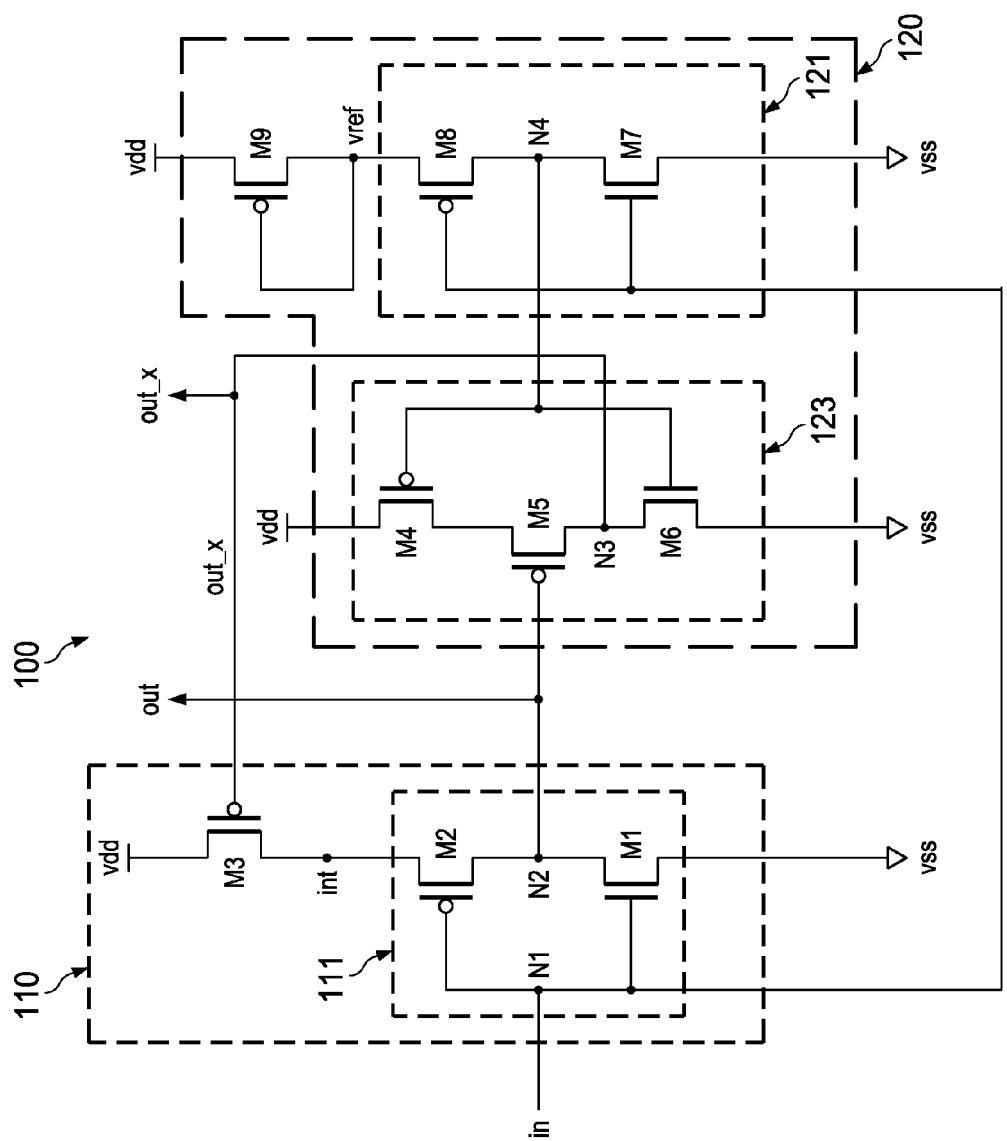
FIG. 2 illustrates an example embodiment of a logic level shifter, according to the invention.

FIG. 2 illustrates an example embodiment of a single supply level shifter circuit 100 according to the invention. As illustrated, the level shifter voltage domain is configured as a single positive $V_{DD}$ supply rail with a ground/reference designated $V_{SS}$. As noted, the $V_{SS}$ ground/reference can be circuit ground (zero volts).

Level shifter 100 includes an input network 110 and an OUT_X network 120. The level shifter receives at an input Node N1 an input logic signal IN with logic_0 and logic_1 states (IN=0 and IN=1). Level shifter 100 converts the IN logic signal received at N1 to a corresponding level shifted output logic signal that can be either OUT (inverted IN) at an OUT Node N2, or OUT_X (corresponding to inverted OUT) at an OUT_X Node N3.

Input network 110 includes an input inverter 111 coupled at an INT Node to the $V_{DD}$ supply rail. Input inverter 111 is coupled between the INT Node and the $V_{SS}$ ground/reference, and is configured to receive IN at IN Node N1, and provide OUT as an inverted IN at the OUT Node N2. The example IN inverter 111 includes NFET M1 and PFET M2. M1/M2 are gate coupled at the IN Node, and drain-coupled at the OUT Node. The PFET M2 source is coupled to the INT Node and the NFET M1 source is coupled to the ground/reference.

Input network 110 includes an INT_Node PFET M3 source coupled to the $V_{DD}$ supply rail and drain coupled to the INT Node. M3 is controlled by an OUT_X control signal, selectively pulling up the INT Node for OUT_X=1. As described below, the OUT_X control signal corresponds to OUT_X generated by the OUT_X network 120 in response to IN at the OUT_X Node N3. Thus, for IN=0 and OUT_X=0, and the resulting OUT_X=1 control signal, PFETs M2 and M3 are switched on to pull up the OUT Node N2 to OUT=1. For IN=1 and OUT_X=1, a resulting OUT_X=1 control signal switches off PFET M3, disconnecting the INT Node (and PFET M2 which is switched off by IN=1) from the $V_{DD}$ supply rail According to aspects of the invention, by comparison with the level shifter design illustrated in FIG. 1, a diode NFET at the INT Node can be eliminated, thereby comparatively reducing loading at the INT Node. As a result, the strength of M2 can be comparatively reduced, with attendant reduction in the sizes of M1 and M3.

OUT_X network 120 is configured to provide OUT_X as an inverted OUT at the OUT_X Node N3, including providing OUT_X as the OUT_X control signal fed back to the INT_Node PFET M3. The OUT_X network includes an IN_X inverter 121 and an OUT_X circuit 123.

IN_X inverter 121 is coupled between the $V_{DD}$ supply rail and the ground/reference. The IN_X inverter is coupled to the IN Node N1, and configured to provide IN_X as an inverted IN at an IN_X Node N4. The example IN_X inverter 121 includes NFET M7 and PFET M8, gate coupled to the IN Node N1, and drain-coupled at the IN_X Node. PFET M8 is source is coupled to the supply rail and NFET M7 is source coupled to the ground/reference. A diode connected PFET M9, coupled between the supply rail and the PFET M8, can be used to reduce the supply voltage at the PFET source.

OUT_X circuit 123 is coupled to receive IN_X from the IN_X Node N4 (IN_X inverter 121), and an OUT control signal corresponding to OUT from the OUT Node N2. The OUT_X circuit is configured to provide OUT_X as an inverted OUT at the OUT Node N3.

OUT_X circuit 123 comprises pull-up/down circuitry for the OUT_X Node N3. The example OUT_X circuit is implemented as a three transistor stack coupled between the $V_{DD}$ supply rail and the ground/reference. OUT_X circuit 123 includes a pull-up PFET M4 and a pull-up OUT_X_Node PFET M5, and a pull-down NFET M6. The PFET/NFET pair M4/M6 are gate coupled to the IN_X Node in the IN_X inverter 121. The pull-up M3 is source coupled to the supply rail, and the pull-down M6 is source coupled to the ground/reference, and drain coupled to the OUT_X Node.

The OUT_X_Node PFET M5 is series coupled between the M4 PFET and the OUT_X Node, and gate coupled to the OUT Node to receive OUT as an OUT control signal. The OUT_X PFET M5 controls the pull-up/down operation of the OUT_X circuit 123 at the OUT_X node.

Figure 1:
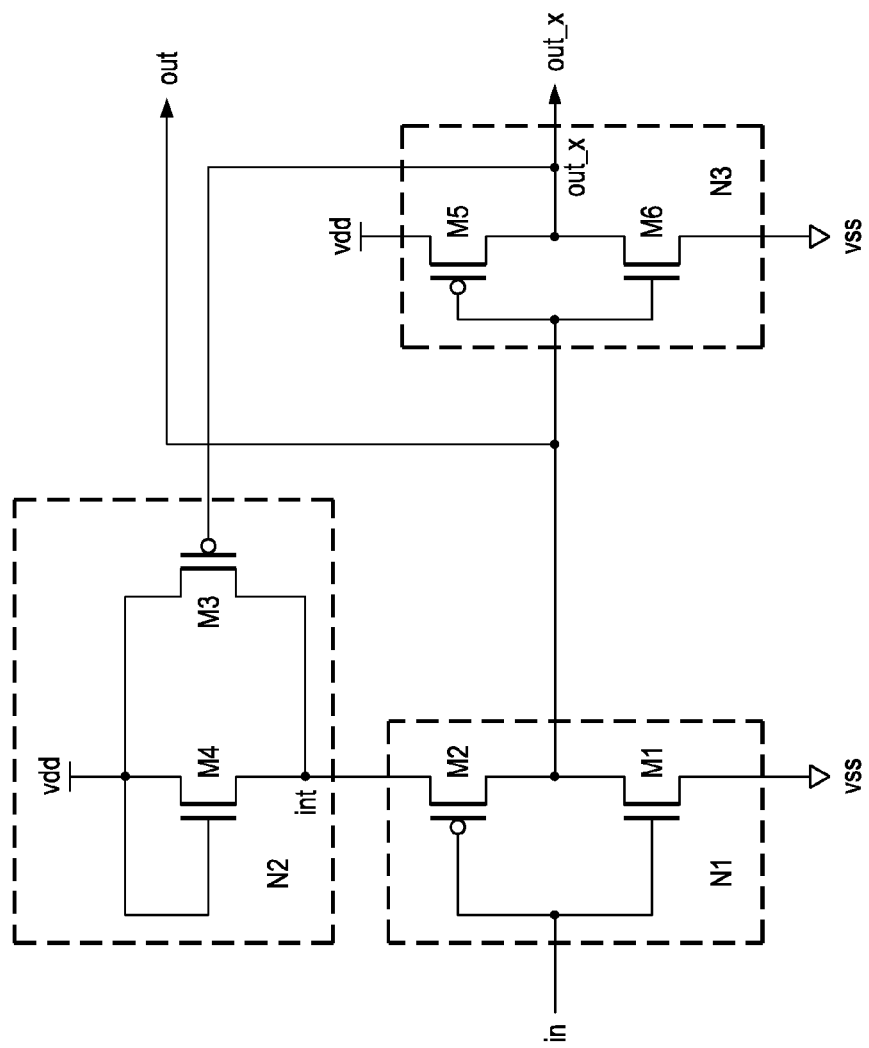
FIG. 1 illustrates a conventional single supply logic level shifter, converting IN into OUT and OUT_X.

According to aspects of the invention, by comparison with the level shifter design illustrated in FIG. 1, OUT Node loading is reduced, and control of the OUT_X Node (including OUT_X=1 rise time) is enhanced. OUT is not used to generate OUT_X (as an inverted IN). Instead, OUT_X is generated with IN_X as an inverted IN (from the IN_X inverter 121), with OUT providing the OUT control signal for the pull-up PFET M5 that controls the OUT_X Node. Note that M7/M8/M9 of the IN_X inverter 121 are only required to generate IN_X, and are not part of the level shift, and can be sized accordingly. Note, also, that, comparatively, OUT Node loading is reduced because the OUT_X Node pull-down NFET M6 does not load the OUT Node.

In operation, for IN=0, the OUT_X circuitry 123 receives IN_X=1 at the pull-up/down pair M4/M6, and an OUT=1 control signal at the OUT_X_Node PFET M5. The pull-up M4 and the pull-up OUT_X_Node PFET M5 are switched off, and the pull-down M6 is switched on to pull down the OUT_X Node to OUT_X=0.

OUT_X=0 is fed back to the PFET M3 controlling the INT_Node as an OUT_X=0 control signal. M3 switches on, pulling up the INT Node, and as a result the OUT Node is pulled up to OUT=1.

For IN=1, the OUT_X circuitry 123 receives IN_X=0 at the pull-up/down pair M4/M6, and an OUT=0 control signal at the OUT_X_Node PFET M5. The pull-up PFET M4 and the OUT_X_Node PFET M5 are switched on, and the pull-down M6 is switched off, pulling up the OUT_X Node to OUT_X=1.

OUT_X=1 is fed back to the PFET M3 controlling the INT_Node as an OUT_X=1 control signal. M3 switches off, terminating INT Node pull-up, and disconnecting the INT Node form the $V_{DD}$ supply rail.

That is, the INT_Node PFET M3 and the OUT_X_Node PFET M5 are controlled respectively by the OUT_X control signal and the OUT control signal.

For IN=0 (OUT=1), the corresponding OUT=1 control signal switches off the OUT_X_Node PFET M5 terminating pull-up of the OUT_X Node, which is pulled down to OUT_X=0. The resulting feedback OUT_X=0 control signal causes the INT_Node PFET M3 to pull-up the INT Node, and thereby pull up the OUT Node to OUT=1.

For IN=1 (OUT=0), the corresponding OUT=0 control signal switches on the OUT_X_Node PFET M5, pulling up the OUT_X Node to OUT_X=1. The resulting feedback OUT_X=1 control signal switches off the INT_Node PFET M3, terminating INT Node pull-up (disconnecting the INT Node from the $V_{DD}$ supply rail).

Figure 3A:
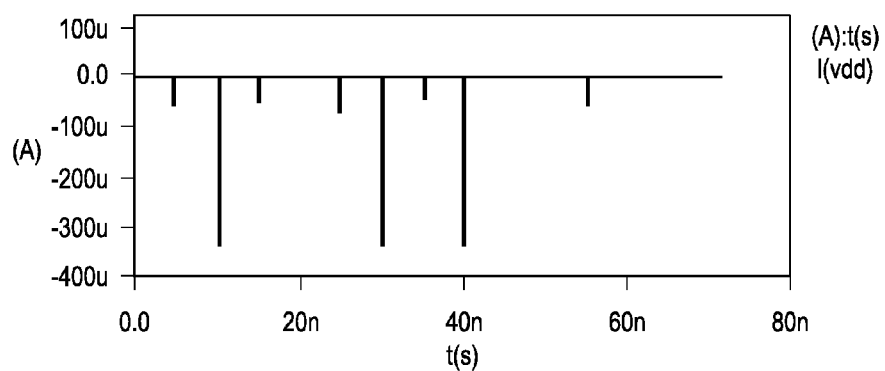
FIGS. 3A-3C provide example waveforms for the example embodiment illustrated in FIG. 2, illustrating respectively: (3A) $I_{VDD}$, (3B) $V_{IN}$, and (3C) $V_{OUT}$.
Figure 3B:
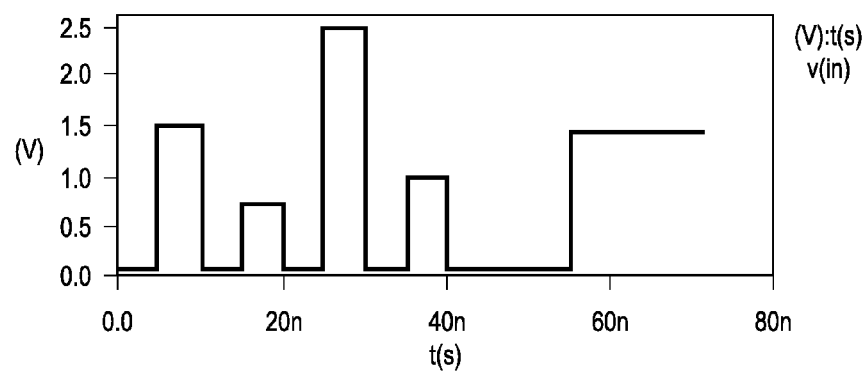
Figure 3C:
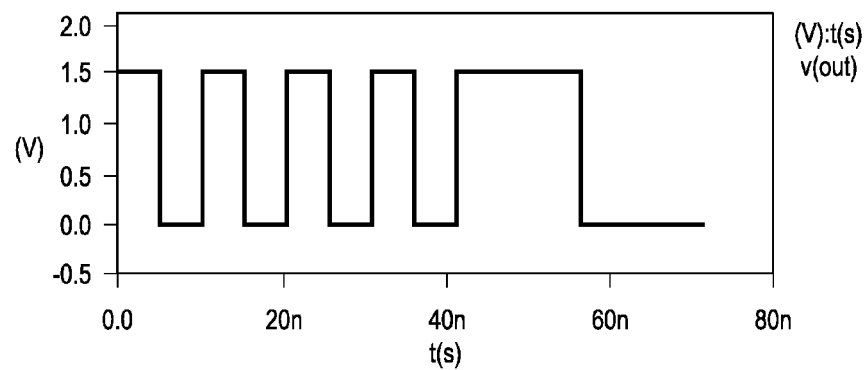

FIGS. 3A-3C provide example waveforms for the example embodiment illustrated in FIG. 1. FIG. 3A illustrates $I_{VDD}$ (current from supply $V_{DD}$), FIG. 3B illustrates $V_{IN}$, and FIG. 3C illustrates the level shifted $V_{OUT}$.

According to aspects of the invention, by comparison with the level shifter design illustrated in FIG. 1, both leakage and OUT/OUT_X rise times (pull-up delays) are reduced. For example: (a) loading is reduced at both the OUT Node and the OUT_X Node, (b) a diode-connected NFET is not required at the INT Node (reducing supply voltage for the IN inverter), and (c) use of a separate IN_X inverter not involved in level shifting reduces pull down requirements (M7 in the example embodiment). Specifically regarding transistor sizing: (a) because INT loading is reduced, M2 size can be reduced, enabling reduction in the size of M1; and (b) in the IN_X inverter, because the pull down M7 can be small, the sizes of M8 and M9 can also be reduced. Further, the three transistor arrangement for the OUT_X circuit (M4/M5/M6) reduces leakage in comparison to the OUT_X output stage in FIG. 1 (M5/M6).

The Disclosure provided by this Description and the Figures sets forth example embodiments and implementations, including associated operations and methods, which illustrate various aspects and features of the invention. This Disclosure can be used by those skilled in the art as a basis for design modifications, substitutions and alternatives to construct other embodiments, including adaptations for other applications. Accordingly, this Disclosure does not limit the scope of the invention, which is defined by the Claims.

The invention claimed is:

1. A logic level shift circuit with a single voltage supply rail for level shifting an input logic signal IN with logic_0 and logic_1 states (IN=0 and IN=1) to a corresponding level shifted output logic signal that is one of OUT or OUT_X (corresponding to an inverted OUT), comprising:
   an IN inverter circuit configured to receive IN at an IN Node, and provide OUT as an inverted IN at an OUT Node, the IN inverter coupled between an INT Node and a ground/reference;
   an INT_Node PFET transistor source coupled to the supply rail and drain coupled to the INT Node, and controlled by an OUT_X control signal corresponding to OUT_X to provide INT Node pull-up in response to an OUT_X=0 control signal;
   an OUT_X network configured to provide OUT_X as an inverted OUT at an OUT_X Node, including providing the OUT_X control signal to the INT_Node PFET, the OUT_X network including:
      an IN_X inverter circuit configured to receive IN from the IN Node, and provide IN_X as an inverted IN at an IN_X Node;
      OUT_X circuitry including
         OUT_X Node pull-up/down circuitry including pull-up PFET and pull-down NFET transistors, gate coupled to the IN_X Node, the pull-up PFET source coupled to the supply rail, and the pull-down NFET drain coupled to the OUT_X Node and source coupled to the ground/reference; and an OUT_X Node PFET transistor series coupled between the pull-up PFET and the OUT_X Node, and gate coupled to the OUT Node to receive OUT as an OUT control signal;

the OUT_X circuitry configured to control OUT_X based on IN_X and the OUT control signal, such that:

for IN=0, the OUT_X circuitry receives IN_X=1 at the pull-up/down PFET and NFET, and an OUT=1 control signal at the OUT_X_Node PFET, pulling down the OUT_X Node to OUT_X=0, and providing an OUT_X=0 control signal to the INT_Node PFET, which pulls-up the INT Node and as a result the OUT Node is pulled up to OUT=1, and for IN=1, the OUT_X circuitry receives IN_X=0 at the pull-up/down PFET and NFET, and an OUT=0 control signal at the OUT_X_Node PFET, pulling up the OUT_X Node to OUT_X=1, and providing an OUT_X=1 control signal to the INT_Node PFET, terminating pull-up of the INT Node.

2. The circuit of claim 1, wherein the INT_Node PFET connects the INT Node to the supply rail, such that, in response to the OUT_X=1 control signal, the INT Node is disconnected from the supply rail.

3. The circuit of claim 1, wherein the IN inverter includes PFET and NFET transistors, gate coupled at the IN Node, and drain-coupled at the OUT Node, the PFET source coupled to the INT Node and the NFET source coupled to the ground/reference.

4. The circuit of claim 1, wherein the IN_X inverter includes PFET and NFET transistors, gate coupled to the IN Node, and drain-coupled at the IN_X Node, the PFET source coupled to the supply rail and the NFET source coupled to the ground/reference.

5. The circuit of claim 4, further comprising a diode connected PFET coupled between the supply rail and the PFET of the IN_X inverter, to reduce the supply voltage at the PFET source.

6. The circuit of claim 1, wherein the ground/reference comprises a circuit ground.

7. A logic level shifter with a single voltage supply rail for level shifting an input logic signal IN with logic_0 and logic_1 states (IN=0 and IN=1) to a corresponding level shifted output logic signal that is one of OUT or OUT_X (corresponding to an inverted OUT), comprising:

an IN inverter configured to receive IN at an IN Node, and provide OUT as an inverted IN at an OUT Node, the inverter including PFET and NFET transistors, gate coupled at the IN Node, and drain-coupled at the OUT Node, the PFET source coupled to an INT Node and the NFET source coupled to ground/reference;

an INT_Node PFET transistor source coupled to the supply rail and drain coupled to the INT Node, and controlled by an OUT_X control signal corresponding to OUT_X to provide INT Node pull-up in response to an OUT_X=0 control signal; and an OUT_X network configured to provide OUT_X as an inverted OUT at an OUT_X Node, including providing the OUT_X control signal to the INT_Node PFET, the OUT_X network including:

an IN_X inverter circuit configured to receive IN from the IN Node, and provide IN_X as an inverted IN at an IN_X Node;

OUT_X circuitry including

OUT_X Node pull-up/down circuitry including pull-up PFET and pull-down NFET transistors, gate coupled to the IN_X Node, the pull-up PFET source coupled to the supply rail, and the pull-down NFET drain coupled to the OUT_X Node and source coupled to the ground/reference; and an OUT_X Node PFET transistor series coupled between the pull-up PFET and the OUT_X Node, and gate coupled to the OUT Node to receive OUT as an OUT control signal;

the OUT_X circuitry configured to control OUT_X based on IN_X and the OUT control signal, such that:

for IN=0, the OUT_X circuitry receives IN_X=1 at the pull-up/down PFET and NFET, and an OUT=1 control signal at the OUT_X_Node PFET, pulling down the OUT_X Node to OUT_X=0, and providing an OUT_X=0 control signal to the INT_Node PFET, which pulls-up the INT Node and as a result the OUT Node is pulled up to OUT=1, and for IN=1, the OUT_X circuitry receives IN_X=0 at the pull-up/down PFET and NFET, and an OUT=0 control signal at the OUT_X_Node PFET, pulling up the OUT_X Node to OUT_X=1, and providing an OUT_X=1 control signal to the INT_Node PFET, terminating pull-up of the INT Node.

8. The logic level shifter of claim 7, wherein the INT_Node PFET connects the INT Node to the supply rail, such that, in response to the OUT_X=1 control signal, the INT Node is disconnected from the supply rail.

9. The logic level shifter of claim 7, wherein the IN_X inverter includes PFET and NFET transistors, gate coupled to the IN Node, and drain-coupled at the IN_X Node, the PFET source coupled to the supply rail and the NFET source coupled to the ground/reference.

10. The logic level shifter of claim 9, further comprising a diode connected PFET coupled between the supply rail and the PFET of the IN_X inverter, to reduce the supply voltage at the PFET source.

11. The logic level shifter of claim 7, wherein the ground/reference comprises circuit ground.

12. A method of level shifting an input logic signal IN with logic_0 (IN=0) and logic_1 (IN=1) states to a corresponding level shifted output logic signal that is one of OUT or OUT_X (corresponding to an inverted OUT), the method operable with a level shifter with a single voltage supply rail, comprising:

in response to the input logic signal IN, providing OUT as an inverted IN at an OUT Node, including pulling up the OUT Node for OUT=1 (inverted IN=0), and pulling down the OUT Node for OUT=0 (inverted IN=1); and providing IN_X as an inverted IN;

providing, based on OUT and IN_X, OUT_X as an inverted OUT at an OUT_X Node, including providing pull-up/down for the OUT_X Node based on respectively IN_X=0 and IN_X=1;

controlling OUT_X Node pull-up/down based on an OUT control signal corresponding to OUT at the OUT Node;

such that, in response to IN_X and the OUT control signal, OUT_X is generated by:

for IN_X=0 and OUT=0, pulling up the OUT_X Node to generate OUT_X=1; and for IN_X=1 and OUT=1, terminating OUT_X Node pull-up, and pulling down the OUT_X Node to OUT_X=0;

based on an OUT_X control signal corresponding to OUT_X, controlling an INT Node coupled between the OUT Node and the supply rail, including pulling up the INT Node based on OUT_X=0, and terminating INT Node pull-up based on OUT_X=1;

thereby controlling pull-up of the OUT and OUT_X Nodes based on respectively the OUT_X and OUT control signals, by:

for IN=0 (OUT=1, OUT_X=0), pulling down the OUT_X Node to OUT_X=0 in response to IN_X=1 and an OUT=1 control signal, and providing an OUT_X=0 control signal to control INT Node pull-up, and as a result pulling up the OUT Node to OUT=1; and for IN=1 (OUT=0, OUT_X=1), pulling up the OUT_X Node to OUT_X=1 in response to IN_X=0 and an OUT=0 control signal, and providing an OUT_X=1 control signal to terminate INT Node pull up, and enable pulling down the OUT Node to OUT=0.

13. The method of claim 12, wherein providing OUT as an inverted IN at an OUT Node is accomplished by an IN inverter including PFET and NFET transistors, gate coupled at the IN Node, and drain-coupled at the OUT Node, the PFET source coupled to the INT Node and the NFET source coupled to the ground/reference.

14. The method of claim 12, wherein the INT Node is controlled by an INT_Node PFET transistor source coupled to the supply rail and drain coupled to the INT Node, and gate coupled to receive the OUT_X control signal.

15. The method of claim 14, wherein the INT_Node PFET connects the INT Node to the supply rail, such that, in response to an OUT_X=1 control signal, the INT Node is disconnected from the supply rail.

16. The method of claim 14, wherein providing OUT_X as an inverted OUT at an OUT_X Node is accomplished by an OUT_X network including:

an IN_X inverter configured to receive IN from the IN Node, and provide IN_X as an inverted IN at an IN_X Node; and OUT_X circuitry including OUT_X Node pull-up/down circuitry including pull-up PFET and pull-down NFET transistors, gate coupled to the IN_X Node, the pull-up PFET source coupled to the supply rail, and the pull-down NFET drain coupled to the OUT_X Node and source coupled to the ground/reference; and an OUT_X Node PFET transistor series coupled between the pull-up PFET and the OUT_X Node, and gate coupled to the OUT Node to receive OUT as an OUT control signal;

the OUT_X circuitry configured to control OUT_X based on IN_X and the OUT control signal, such that:

for IN=0, the OUT_X circuitry receives IN_X=1 at the pull-up/down PFET and NFET, and an OUT=1 control signal at the OUT_X_Node PFET, pulling down the OUT_X Node to OUT_X=0, and providing an OUT_X=0 control signal to the INT_Node PFET, which pulls-up the INT Node and as a result the OUT Node is pulled up to OUT=1, and for IN=1, the OUT_X circuitry receives IN_X=0 at the pull-up/down PFET and NFET, and an OUT=0 control signal at the OUT_X_Node PFET, pulling up the OUT_X Node to OUT_X=1, and providing an OUT_X=1 control signal to the INT_Node PFET, terminating pull-up of the INT Node.

17. The method of claim 16, wherein the IN_X inverter includes PFET and NFET transistors, gate coupled to the IN Node, and drain-coupled at the IN_X Node, the PFET source coupled to the supply rail and the NFET source coupled to the ground/reference; and further comprising a diode connected PFET coupled between the supply rail and the PFET of the IN_X inverter, to reduce the supply voltage at the PFET source.

18. The method of claim 12, wherein the ground/reference comprises circuit ground.

* * * * *